(12) United States Patent
McMahon et al.

(10) Patent No.: US 8,907,687 B2
(45) Date of Patent: Dec. 9, 2014

(54) INTEGRATED CIRCUIT WITH STRESS GENERATOR FOR STRESSING TEST DEVICES

(75) Inventors: William McMahon, Scarsdale, NY (US); Richard Francis, Sunnyvale, CA (US); Randy W. Mann, Milton, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 295 days.

(21) Appl. No.: 13/462,942

(22) Filed: May 3, 2012

(65) Prior Publication Data

US 2013/0293250 A1 Nov. 7, 2013

(51) Int. Cl.
*G01R 31/02* (2006.01)
(52) U.S. Cl.
USPC .................................. 324/750.01; 324/762.09

(58) Field of Classification Search
USPC ................................ 324/750.01, 762.09, 537
See application file for complete search history.

(56) References Cited

U.S. PATENT DOCUMENTS

| 5,381,373 A * | 1/1995 | Ohsawa ......................... 365/201 |
| 6,057,698 A * | 5/2000 | Heo et al. ..................... 324/750.03 |
| 6,879,177 B1 * | 4/2005 | Bolam et al. .............. 324/762.09 |
| 7,589,551 B1 * | 9/2009 | Yang et al. ................ 324/750.01 |
| 2009/0033408 A1 * | 2/2009 | Fifield ............................ 327/537 |

* cited by examiner

*Primary Examiner* — Vincent Q Nguyen
(74) *Attorney, Agent, or Firm* — Amerson Law Firm, PLLC

(57) ABSTRACT

An integrated circuit device includes at least one test device and a stress generator coupled to the test device and operable to cycle the at least one test device to generate an AC stress. A method for testing an integrated circuit device including at least one test device and a stress generator coupled to the test device includes enabling the stress generator to cycle the at least one test device to generate an AC stress and measuring at least one parameter of the test device to determine an effect of the AC stress.

23 Claims, 5 Drawing Sheets

INTEGRATED CIRCUIT WITH STRESS GENERATOR FOR STRESSING TEST DEVICES

CROSS-REFERENCE TO RELATED APPLICATIONS

Not applicable.

BACKGROUND

The disclosed subject matter relates generally to integrated circuits and, more particularly, to a device having bias temperature instability test structures and a system for measuring the test structures.

Bias Temperature Instability (BTI) is an issue in deep submicron technologies. BTI affects devices which are kept in an active state for extended periods of time. For example, a custom array, or any domino circuit, often requires a keeper to hold the voltage on pre-charged bitlines if none of the pull-down transistors fire. To be properly sized, the keeper should be large enough to compensate the pull down leakage under worst process corners and noise considerations and should also be small enough to ensure fast evaluation when pull-down transistors do fire. However, negative bias temperature instability (NBTI) effectively weakens the keeper PFET over time. Positive bias temperature instability (PBTI) also has the potential to weaken pull-down NFETs over time.

Current testing methodology for determining the effects of BTI requires the use of automated die stepping on individual devices. This testing technique may require long periods of time to generate data for a single test condition. Also, automated test equipment requires significant capital expenditures. Hence, the available testing resources may be limited, further increasing the potential for delay in ascertaining BTI test results.

This section of this document is intended to introduce various aspects of art that may be related to various aspects of the disclosed subject matter described and/or claimed below. This section provides background information to facilitate a better understanding of the various aspects of the disclosed subject matter. It should be understood that the statements in this section of this document are to be read in this light, and not as admissions of prior art. The disclosed subject matter is directed to overcoming, or at least reducing the effects of, one or more of the problems set forth above.

BRIEF SUMMARY

The following presents a simplified summary of the disclosed subject matter in order to provide a basic understanding of some aspects of the disclosed subject matter. This summary is not an exhaustive overview of the disclosed subject matter. It is not intended to identify key or critical elements of the disclosed subject matter or to delineate the scope of the disclosed subject matter. Its sole purpose is to present some concepts in a simplified form as a prelude to the more detailed description that is discussed later.

One aspect of the disclosed subject matter is seen in an integrated circuit device including at least one test device and a stress generator coupled to the test device and operable to cycle the at least one test device to generate an AC stress.

Another aspect of the disclosed subject matter is seen in a method for testing an integrated circuit device including at least one test device and a stress generator coupled to the test device. The method includes enabling the stress generator to cycle the at least one test device to generate an AC stress and measuring at least one parameter of the test device to determine an effect of the AC stress.

BRIEF DESCRIPTION OF THE SEVERAL VIEWS OF THE DRAWINGS

The disclosed subject matter will hereafter be described with reference to the accompanying drawings, wherein like reference numerals denote like elements, and.

Figure 1:
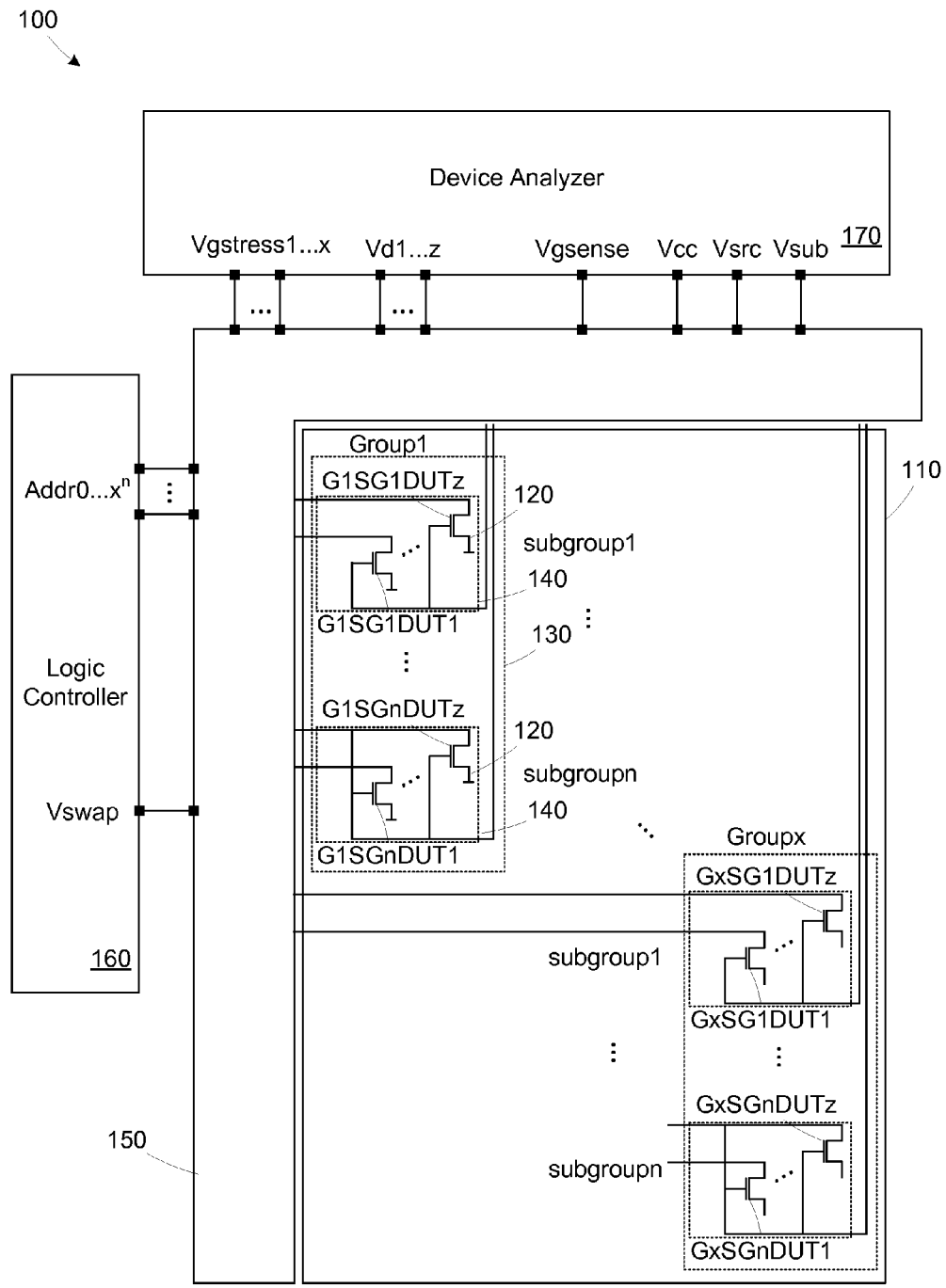
FIG. 1 is a simplified diagram of a testing system 100 in accordance with an embodiment of the present subject matter.

While the disclosed subject matter is susceptible to various modifications and alternative forms, specific embodiments thereof have been shown by way of example in the drawings and are herein described in detail. It should be understood, however, that the description herein of specific embodiments is not intended to limit the disclosed subject matter to the particular forms disclosed, but on the contrary, the intention is to cover all modifications, equivalents, and alternatives falling within the spirit and scope of the disclosed subject matter as defined by the appended claims.

DETAILED DESCRIPTION

One or more specific embodiments of the disclosed subject matter will be described below. It is specifically intended that the disclosed subject matter not be limited to the embodiments and illustrations contained herein, but include modified forms of those embodiments including portions of the embodiments and combinations of elements of different embodiments as come within the scope of the following claims. It should be appreciated that in the development of any such actual implementation, as in any engineering or design project, numerous implementation-specific decisions must be made to achieve the developers' specific goals, such as compliance with system-related and business related constraints, which may vary from one implementation to another. Moreover, it should be appreciated that such a development effort might be complex and time consuming, but would nevertheless be a routine undertaking of design, fabrication, and manufacture for those of ordinary skill having the benefit of this disclosure. Nothing in this application is considered critical or essential to the disclosed subject matter unless explicitly indicated as being "critical" or "essential."

The disclosed subject matter will now be described with reference to the attached figures. Various structures, systems and devices are schematically depicted in the drawings for purposes of explanation only and so as to not obscure the disclosed subject matter with details that are well known to those skilled in the art. Nevertheless, the attached drawings are included to describe and explain illustrative examples of the disclosed subject matter. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Referring now to the drawings wherein like reference numbers correspond to similar components throughout the several views and, specifically, referring to FIG. 1, the disclosed subject matter shall be described in the context of a testing system 100 for interfacing with an integrated circuit 110, which may be an integrated circuit die. The integrated circuit may be formed on a wafer including multiple other die or it may be a single die or device. The integrated circuit 110 includes a plurality of devices under test (DUTs) 120. The DUTs 120 may be arranged into groups 130, where each group 130 includes a plurality of subgroups 140 and each subgroup 140 includes a plurality of DUTs 120. As shown in FIG. 1, x groups 130, n subgroups 140 in each group 130, and z DUTs 120 in each subgroup 140 are illustrated. The number of groups 130, the number of subgroups 140, and the number of DUTs 120 in a subgroup 140 may vary depending on the particular implementation. An individual DUT 120 may designated by group and subgroup using the name GxSGnDUTz, where x represents the group number, n represents the subgroup number, and z represents the DUT number.

In the illustrated embodiment, the DUTs 120 are transistors. The DUTs 120 may be single transistors or part of a transistor circuit, such as a static random access memory (SRAM) cell. Different groups 130 or subgroups 140 may correspond to different transistors in the same transistor circuit. For example, one group 130 may represent pull-down transistors in an SRAM cell, while different groups 130 may represent pass and/or pull-up transistors in the same or a different SRAM cell. The devices in the groups 130 or subgroups 140 may also differ. For example, the geometry (e.g., critical dimension) of the devices in the DUT 120 may vary across groups 130 or subgroups 140 to allow the effects of geometric variation on BTI degradation to be evaluated.

In the illustrated embodiment, the testing system 100 includes a probe card 150 for interfacing with the integrated circuit 110 (the actual shape of the probe card 150 is not illustrated in FIG. 1), a logic controller 160 for generating signals to address the DUTs 120 and control the test configuration, and a device analyzer 170 for analyzing the performance of the DUTs 120.

The logic controller 160 generates a plurality of address signals, Addr0 ... x", for accessing the integrated circuit 110 and selecting a particular group 130 of DUTs 120 and a Vswap signal for controlling the testing, as described in greater detail below. In the illustrated embodiment, the logic controller 160 may be implemented using a digital waveform generator/analyzer, such as a PCI-6541 offered commercially by National Instruments of Austin, Tex.

The device analyzer 170 generates a plurality of stress signals, Vgstress1 ... x, for stressing the DUTs 120. Each group 130 and all of its subgroups 140 receives a common Vgstress signal. Hence, the device analyzer 170 provides x Vgstress signals corresponding to the x groups 130. The device analyzer 170 monitors the performance of the DUTs 120 in a selected subgroup 140 by monitoring a plurality of device signals, Vd1 ... z, corresponding to the z DUTs 120 in each subgroup 140. The device analyzer 170 includes source-measure units (SMU) for measuring the characteristics of the DUTs 120. The device analyzer 170 generates a Vgsense signal for measuring the DUTs 120, a Vsrc voltage for providing a source voltage to the DUTs 120 (e.g., ground), and a Vsub voltage for providing a substrate voltage to the DUTs 120 (e.g., ground). The use of the Vsrc and Vsub signals may be optional depending on the particular nature of the DUTs 120. In the illustrated embodiment, the device analyzer 170 may be implemented using a B1500 device analyzer offered commercially by Agilent Technologies of Santa Clara, Calif.

Figure 2:
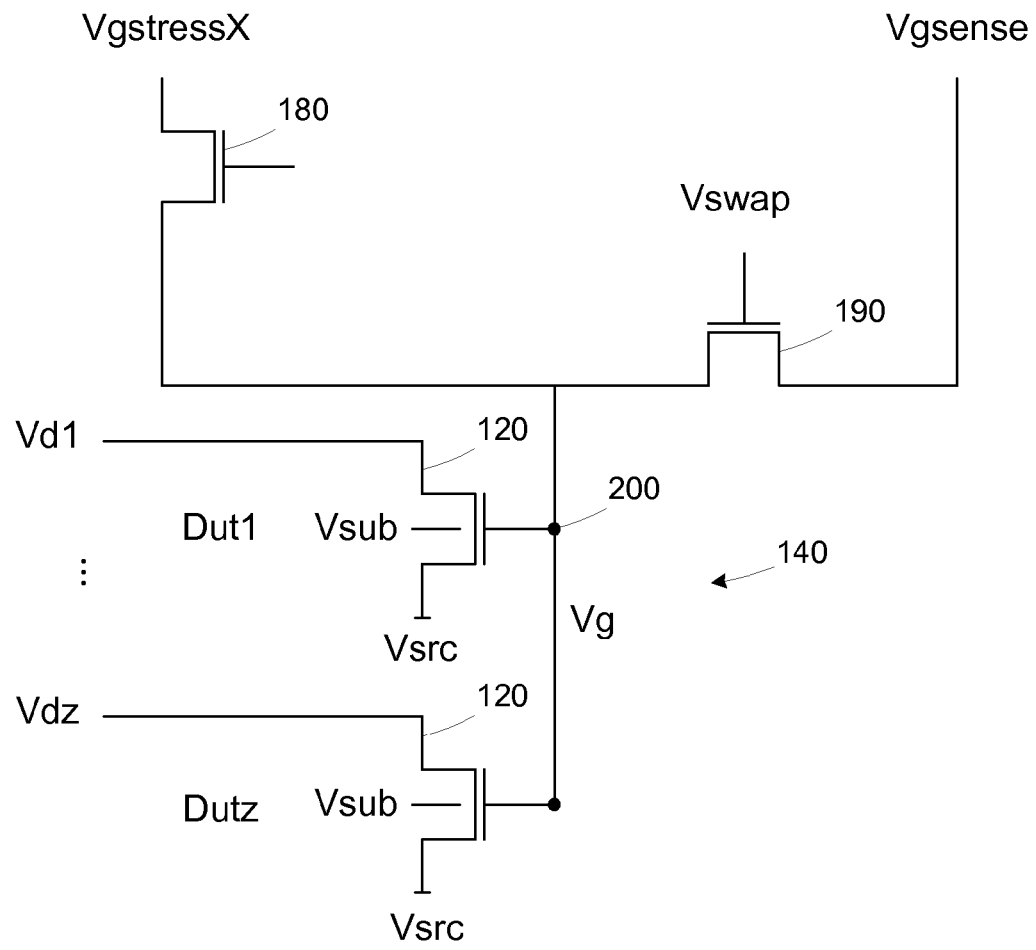
FIG. 2 is a simplified diagram illustrating the operation of the testing system of FIG. 1 for testing a subgroup of an array of devices under test.

Referring to FIG. 2, a simplified diagram illustrating the testing system 100 interfacing with the selected subgroup 140 is shown. By applying an address to the DUT 120, the logic controller 160 selects a particular group 130. The most significant bits of the address designate the group 130, and the least significant bits designate a subgroup 140 within the addressed group 140. A stress transistor 180 on the integrated circuit 100 is controlled based on the address to route the particular VgstressX signals to the subgroups 140. In FIG. 2, only the stress transistor 180 associated with the selected subgroup 140 is shown. All of the subgroups 140 in the selected group 130 receive the same VgstressX signal. The integrated circuit 110 also includes a swap transistor 190 controllable by the Vgswap signal to equalize the node gate 200 coupled to the gates of the DUTs 120.

Figure 3:
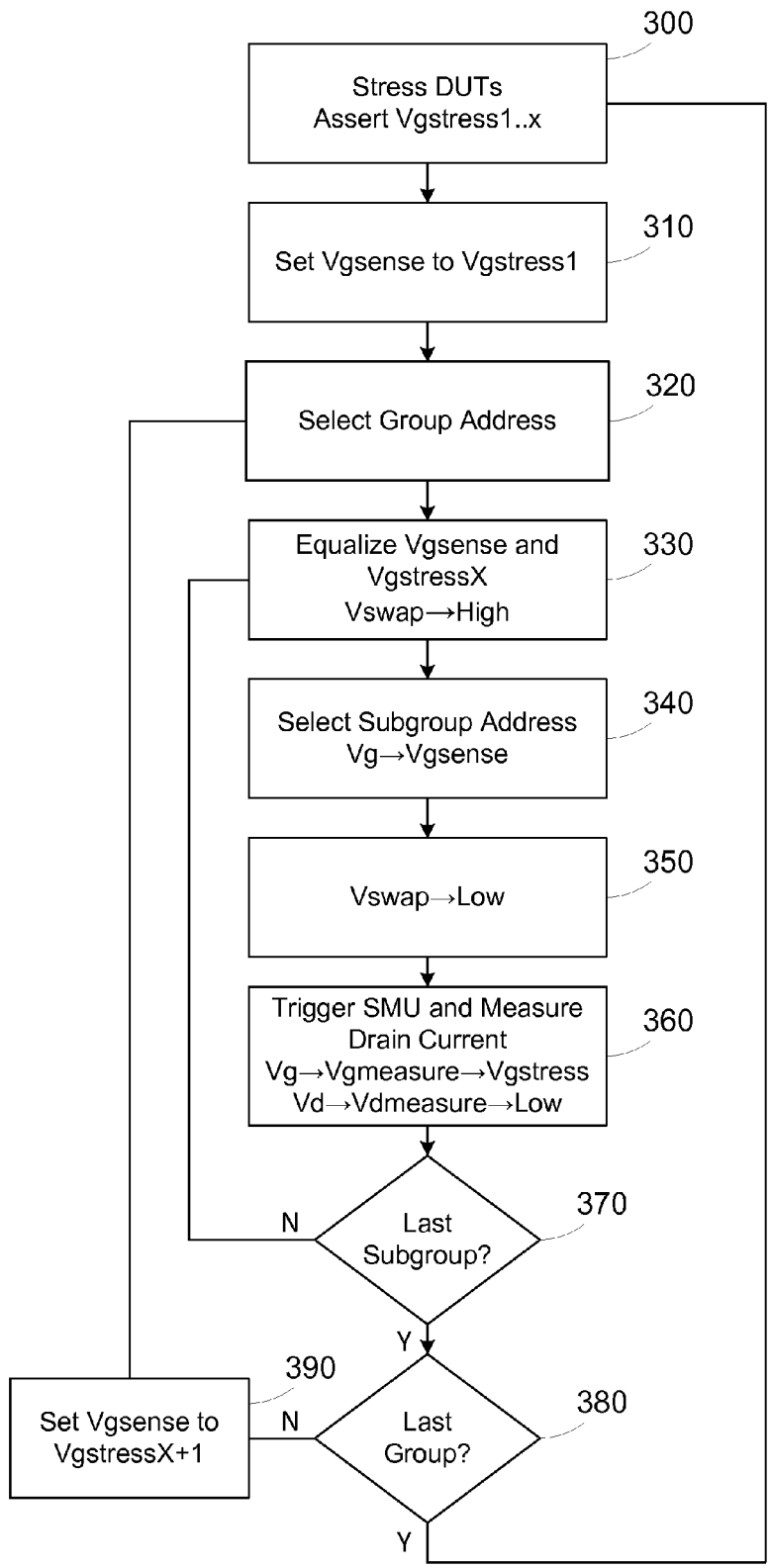
FIG. 3 is a simplified flow diagram of a method of testing devices in the system of FIG. 1.

Turning now to FIG. 3 a simplified flow diagram illustrating the technique employed by the testing system 100 for testing the DUTs 120. In method block 300, the DUTs 120 are stressed by asserting Vgstress1 ... x. Various types of stress maybe applied, such as DC stress (e.g., constant voltage) or AC stress (e.g., device cycling at various duty cycles and/or frequencies). In method block 310, a testing cycle begins by setting Vgsense equal to Vgstress1, which is corresponds to stress signal applied to the first group 130. The group address is selected in method block 320. In method block 330, Vsawp is asserted to equalize Vgsense and VgstressX (i.e., corresponding to the group address selected). In method block 340, the subgroup address is selected, which aligns the Vd lines of the DUTs 120 in the selected subgroup 140 to the SMU in the device analyzer 170. The voltage at the gates of the Duts 120, Vg, is set to Vgsense.

The testing of the DUTs 120 in the selected subgroup 140 begins in method block 350, where Vswap is deasserted to isolate Vgsense from the gate node 200. In method block 360, the SMU in the device analyzer 170 is triggered. During the characterization of the DUTs 120, the voltage at the gate node 200, Vg, is set at Vgmeasure, which represents the nominal operating voltage of the DUTs 120, and the voltage at the drains, Vd, is concurrently set to Vdmeasure, again representing a nominal operating voltage. The device analyzer 170 measures the drain current. The voltage at the gate node 200, Vg, is then transitioned back to VgstressX, and the voltage at the drains, Vd, is taken low (e.g., ground).

In method block 370, the test iteration repeats for the next subgroup 140 and the flow returns to method block 330. If the last subgroup 140 has been tested, the test iteration repeats in method block 380 for the next group 130. Incrementing the group number changes the VgstressX line associated with the subgroups 140, so Vgsense is changed to the next VgstressX+1 line in method block 390. After completion of the last group in method block 380, the testing system 100 may transition back to stressing the DUTs 120 in method block 300.

Figure 4:
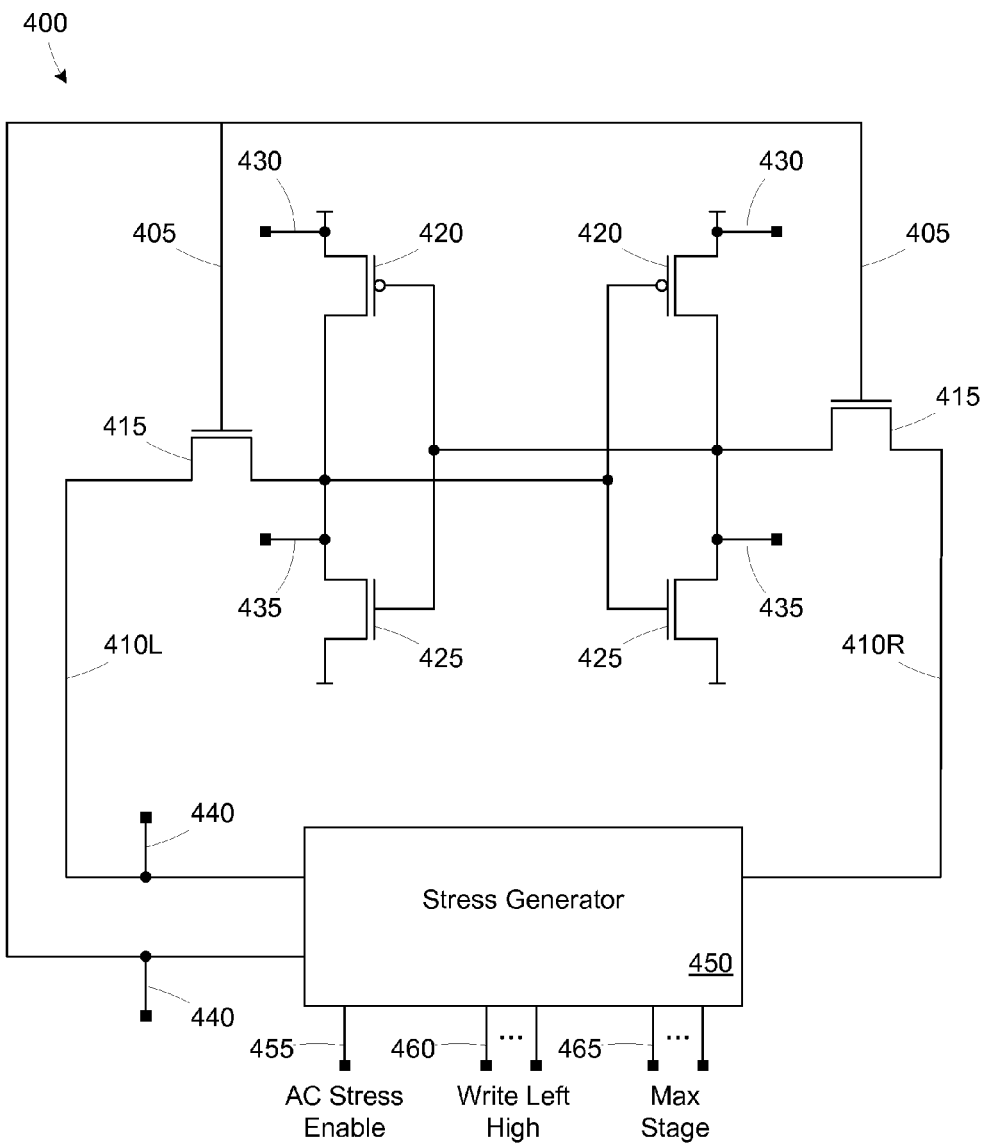
FIG. 4 is a diagram of a memory cell that may be tested by the system of FIG. 1 and an integrated stress generator for generating AC stress for the cell.

In FIG. 2, the DUT 120 is illustrated as being a single transistor. In some embodiments, the DUT 120 may be an SRAM cell 400 as illustrated in FIG. 4, or discrete elements in the SRAM cell 400. The SRAM cell 400 includes wordlines 405, bit lines 410L, 410R, pass transistors 415, pull-up transistors 420, and pull-down transistors 425. The cross-coupled pull-up transistors 420, and pull-down transistors 425 define a storage element of the SRAM cell 400, and the pass transistors 415 are controlled by the wordlines 405 to enable the storage element to be accessed for a read or write operation via the bit lines 410L, 410R. The SRAM cell 400 illustrated in FIG. 4 is a conventional 6T SRAM cell. Other memory cell topologies, may be used for the DUTs 120, such as 4T cells, flash memory cells, or some other memory cell type. The principles of operation for an SRAM cell are known, so they are not described in detail herein. Stress voltages may be applied to the pull-up transistors 420 and pull-down transistors 430 by controlling the voltage on the bit lines 410L, 410R, and stress voltages may be applied to the pass transistors 415 by controlling the voltage on the wordlines 405.

The test system 100 may measure one or more characteristics of the SRAM cell 400 or the effects of BTI on individual transistors 410, 415L, 415R, 420, 425 of the cell 400. For example, taps 430 may be used to measure the pull-up transistors 420 and/or taps 435 may be used to measure the pull-down transistors 425. A tap 440 coupled to the one of the bit lines 410L, 410R may be used to measure the performance of the entire cell 400 after BTI stress. For example, a critical current parameter, $I_{CRIT}$, for the cell 400 may be measured during a read cycle to determine the static noise margin of the cell 400. Although not illustrated in FIG. 4, additional devices may be added to the circuit to allow isolation of the individual transistors 410, 415L, 415R, 420, 425 from the cell 400 during measurement. Also, the cross-coupling between the left and right sides of the memory cell 400 may be isolated during measurement to allow measurement of individual transistors 410, 415L, 415R, 420, 425 of the cell 400.

In the illustrated embodiment, the integrated circuit 110 includes an integrated stress generator 450. The stress generator 450 generates AC stress for the devices in the cell 400 by repeatedly cycling to simulate read or write cycles. Because, the stress generator 450 is integrated, it may employ higher frequency signals for cycling the cell 400 than would be achievable using external pads. The stress generator 450 allows all of the transistors in the cell 400 to be stressed at once. Subsequently, the effects of the stress can be measured for individual transistors or for the overall cell 400.

In the illustrated embodiment, the stress generator 450 includes a programmable ring oscillator with selectable stages. The stress generator 450 includes an AC stress enable input 455, write left high inputs 460 that specify the stage at which a low to high transition occurs on the left side of the cell 400, and max stage inputs 465 that specify the number of stages employed in the oscillator. The AC stress enable input 455 allows the stress generator 450 to be selectively turned on and off. For example, during the testing iteration shown in FIG. 3, the stress generator 450 could be turned on in method block 300 to generate AC stress, and then turned off in method block 310 to allow the testing. The write left high inputs 460 determine the duty cycle of the waveform generated by the stress generator 450 by designating the stage of the ring oscillator at which the left bit line 410L is driven high and the right bit line 410R is driven low while the wordline 405 is driven high. The max stage inputs 465 determine the frequency by setting the overall length of the ring oscillator circuit and determining the stage at which the SRAM logic value is reversed (i.e., the left bit line 410L is driven low and the right bit line 410R is driven high while the wordline 405 is driven high). The stress generator 450 may simulate write cycles, read cycles, or some combination thereof, for the memory cell 400.

The stress generator 450 also includes write and sense circuitry for accessing the memory cell 400. The write and sense circuitry may mimic the circuitry found in actual production devices, so that the stress conditions generated by the stress generator 450 correspond to those expected in the production devices.

Figure 5:
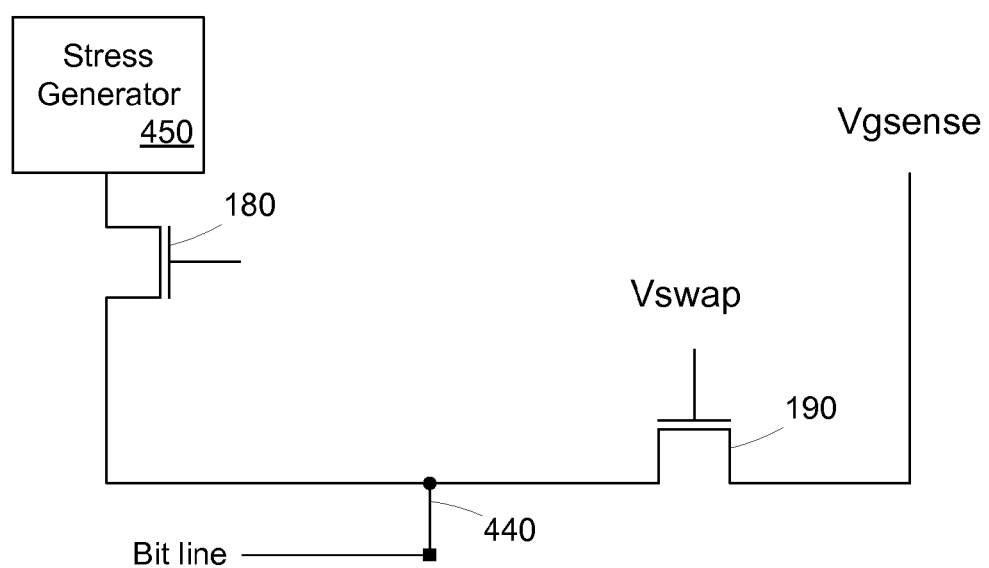
FIG. 5 is a simplified diagram illustrating the operation of the testing system of FIG. 1 for testing the memory cell of FIG. 4.

FIG. 5 is a simplified diagram illustrating the operation of the testing system of FIG. 1 for testing the memory cell of FIG. 4. The stress transistor 180 on the integrated circuit 100 is controlled based on the selected address to route the stress generator 450 bitline signals to the subgroups 140. In FIG. 5, only the stress transistor 180 associated with the selected subgroup 140 is shown. All of the subgroups 140 in the selected group 130 receive the same stress generator signals. The swap transistor 190 is controllable by the Vgswap signal to isolate the stress generator 450 and allow the $I_{CRIT}$ measurement to be taken on the bitline 440.

The testing circuit 100 described herein allows the effects of BTI stress to be determined without requiring the use of automated test equipment devices. The integrated stress generator 450 allows AC stress to be generated and applied at frequencies corresponding to device normal operating conditions.

The particular embodiments disclosed above are illustrative only, as the disclosed subject matter may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the disclosed subject matter. Accordingly, the protection sought herein is as set forth in the claims below.

We claim:

1. An integrated circuit device, comprising:
   at least one test device;
   an external stress voltage terminal coupled to the at least one test device wherein the at least one test device comprises a test transistor and the external stress voltage terminal is coupled to a gate of the test transistor;
   an external device terminal coupled to a drain of the test transistor;
   a stress transistor having source and drain terminals coupled between the external stress voltage terminal and the gate of the test transistor;
   an external sense terminal coupled to the gate of the test transistor;
   a swap transistor having source and drain terminals coupled between the external sense terminal and the gate of the test transistor;
   an external swap terminal coupled to a gate of the swap transistor; and
   a stress generator operable to connect an external stress voltage signal received on the stress voltage terminal to the at least one test device to cycle the at least one test device and generate an AC stress on the at least one test device.

2. The integrated circuit device of claim 1, further comprising a plurality of test devices, wherein at least a first subset of the test devices is coupled to the external stress voltage terminal and the stress generator.

3. The integrated circuit device of claim 1, further comprising:
   a plurality of test devices arranged into groups, each group having a plurality of sub-groups; and a plurality of external stress voltage terminals, wherein each group is coupled to one of the external stress voltage terminals, and all of the sub-groups in a particular group is coupled to the one of the external stress voltage terminals coupled to the particular group.

4. The integrated circuit device of claim 1, wherein the at least one test device comprises a memory cell.

5. The integrated circuit device of claim 4, wherein the stress generator comprises a first terminal coupled to a wordline of the memory cell, a second terminal coupled to a first bit line of the memory cell, and a third terminal coupled to a second bit line of the memory cell, and the stress generator is operable to selectively assert and deassert signals on the first, second, and third terminals to cycle the memory cell.

6. The integrated circuit device of claim 5, further comprising:
an external stress voltage terminal coupled to a gate of a transistor in the memory cell; and
an external device terminal coupled to a source of the transistor.

7. The integrated circuit device of claim 6, wherein the transistor comprises one of a pass transistor of the memory cell, a pull-up transistor of the memory cell, or a pull-down transistor of the memory cell.

8. The integrated circuit device of claim 5, further comprising an external device terminal coupled to the bit line.

9. The integrated circuit device of claim 8, further comprising:
a first transistor having source and drain terminals coupled between one of the second and third terminals and the stress generator;
a second transistor having source and drain terminals coupled between the external device terminal and the one of the second and third terminals;
a first external terminal coupled to a gate of the first transistor; and
a second external terminal coupled to a gate of the second transistor.

10. The integrated circuit device of claim 4, wherein the memory cell comprises a static random access memory cell.

11. The integrated circuit device of claim 5, further comprising:
an external stress voltage terminal coupled to a gate of a transistor in the memory cell; and
an external device terminal coupled to a source of the transistor.

12. The integrated circuit device of claim 1, wherein the stress generator comprises a ring oscillator circuit.

13. The integrated circuit device of claim 12, wherein the ring oscillator circuit comprises:
first and second output terminals;
a plurality of stages;
a first configuration terminal for receiving a first input designating a first particular stage at which the first output terminal is asserted and the second output terminal is deasserted; and
a second configuration terminal for receiving a second input designating a second particular stage at which the logic values on the first and second output terminal are reversed.

14. The integrated circuit device of claim 13, wherein the ring oscillator circuit comprises an enable terminal.

15. The integrated circuit device of claim 1, further comprising:
a plurality of test devices arranged into groups, each group having a plurality of sub-groups; and a plurality of external stress voltage terminals, wherein each group is coupled to one of the external stress voltage terminals, and all of the sub-groups in a particular group is coupled to the one of the external stress voltage terminals coupled to the particular group.

16. The integrated circuit device of claim 1, wherein the at least one test device comprises a memory cell, the stress generator comprises a first terminal coupled to a wordline of the memory cell, a second terminal coupled to a first bit line of the memory cell, and a third terminal coupled to a second bit line of the memory cell, and the stress generator is operable to selectively assert and deassert signals on the first, second, and third terminals to cycle the memory cell.

17. A method for testing an integrated circuit device including at least one test device, a stress voltage terminal coupled to the at least one test device, and a stress generator coupled to the test device, comprising:
enabling the stress generator to connect an external stress voltage signal received on the stress voltage terminal to the at least one test device to cycle the at least one test device to generate an AC stress, wherein the stress generator comprises first and second output terminals, a plurality of stages, a first configuration terminal for receiving a first input designating a first particular stage at which the first output terminal is asserted and the second output terminal is deasserted, and a second configuration terminal for receiving a second input designating a second particular stage at which the logic values on the first and second output terminal are reversed; and
measuring at least one parameter of the test device to determine an effect of the AC stress.

18. The method of claim 17, wherein the at least one test device comprises a test transistor, the external stress voltage terminal is coupled to a gate of the test transistor, and the integrated circuit device includes an external device terminal coupled to a drain of the test transistor, and wherein measuring at least one parameter of the test device comprises measuring a drain current of the test transistor.

19. The method of claim 17, wherein the integrated circuit comprises a plurality of test devices and a plurality of external device terminals coupled to the plurality of test devices, wherein at least a first subset of the test devices is coupled to the external stress voltage terminal and the stress generator, and the method further comprises:
enabling the stress generator to cycle the test devices in the first subset in parallel; and
measuring at least one parameter of each test device in the first subset in parallel using the plurality of external device terminals.

20. The method of claim 17, wherein the test device comprises a memory cell, and the stress generator comprises a first terminal coupled to a wordline of the memory cell, a second terminal coupled to a first bit line of the memory cell, and a third terminal coupled to a second bit line of the memory cell, and enabling the stress generator further comprises selectively asserting and deasserting signals on the first, second, and third terminals to cycle the memory cell.

21. The method of claim 20, wherein measuring at least one parameter of the test device comprises measuring a critical current parameter of the memory cell.

22. An integrated circuit device, comprising:
at least one test device;
an external stress voltage terminal coupled to the at least one test device; and
a stress generator operable to connect an external stress voltage signal received on the stress voltage terminal to the at least one test device to cycle the at least one test device and generate an AC stress on the at least one test device, wherein the stress generator comprises a ring oscillator circuit, comprising:

first and second output terminals;

a plurality of stages;

a first configuration terminal for receiving a first input designating a first particular stage at which the first output terminal is asserted and the second output terminal is deasserted; and a second configuration terminal for receiving a second input designating a second particular stage at which the logic values on the first and second output terminal are reversed.

23. The integrated circuit device of claim 22, wherein the ring oscillator circuit comprises an enable terminal.

* * * * *